United States Patent
Zhai et al.

(10) Patent No.: US 8,421,462 B2
(45) Date of Patent: Apr. 16, 2013

(54) SINUSOIDALLY RESONANT RADIO FREQUENCY VOLUME COILS FOR HIGH FIELD MAGNETIC RESONANCE APPLICATIONS

(75) Inventors: Zhiyong Zhai, Mayfield Heights, OH (US); Michael A. Morich, Mentor, OH (US); Gordon D. Demeester, Wickliffe, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 606 days.

(21) Appl. No.: 12/528,536

(22) PCT Filed: Jan. 30, 2008

(86) PCT No.: PCT/IB2008/050324
§ 371 (c)(1),
(2), (4) Date: Aug. 25, 2009

(87) PCT Pub. No.: WO2008/104894
PCT Pub. Date: Sep. 4, 2008

(65) Prior Publication Data
US 2010/0117642 A1    May 13, 2010

Related U.S. Application Data

(60) Provisional application No. 60/891,538, filed on Feb. 26, 2007.

(51) Int. Cl.
*G01V 3/00* (2006.01)
(52) U.S. Cl.
USPC ........................................ 324/318; 324/322

(58) Field of Classification Search .......... 324/300–322; 600/407–445
See application file for complete search history.

(56) References Cited

U.S. PATENT DOCUMENTS 5,202,635 A    4/1993  Srinivasan et al.
(Continued)

FOREIGN PATENT DOCUMENTS

CN    85106676 A    3/1986
CN    1274563 A    11/2000
(Continued)

OTHER PUBLICATIONS

Alecci, M., et al.; Theoretical and Experimental Evaluation of Detached Endcaps for Birdcage Coils; 2001; Proc. Intl. Soc. Mag. Reson. Med.;9:1091.
Findeklee, C., et al.; Efficient Design of a novel Double Tuned Quadrature Headcoil for Simultaneous 1H and 31P MRI/MRS at 7T; 2005; Proc. Intl. Soc. Mag. Reson. Med.;13:891.

*Primary Examiner* — Brij Shrivastav (57) ABSTRACT

A radio frequency coil assembly includes an annular conductor (20, 22, 120) configured to support a sinusoidal electrical current distribution at a magnetic resonance frequency, and a radio frequency shield (30, 32, 34, 52, 60, 61, 130) shielding the annular conductor in at least one direction, the radio frequency shield including at least one of (i) a cylindrical shield portion (30, 60, 61, 130) surrounding a perimeter of the annular conductor, and (ii) a planar shield portion (32, 34, 52) arranged generally parallel with the annular conductor. In a magnetic resonance scanner embodiment, a magnet (10) generates a static magnetic field ($B_0$), a magnetic field gradient system (14) is configured to superimpose selected magnetic field gradients on the static magnetic field, and said radio frequency coil assembly is arranged with the annular conductor generally transverse to the static magnetic field ($B_0$).

33 Claims, 7 Drawing Sheets

U.S. PATENT DOCUMENTS

| | | | |
|---|---|---|---|
| 5,554,929 A * | 9/1996 | Doty et al. | 324/318 |
| 5,557,247 A | 9/1996 | Vaughn, Jr. | |
| 6,249,121 B1 | 6/2001 | Boskamp et al. | |
| 6,396,271 B1 | 5/2002 | Burl et al. | |
| 6,822,448 B2 | 11/2004 | Watkins et al. | |
| 7,119,541 B2 | 10/2006 | Barberi | |
| 7,196,603 B2 * | 3/2007 | Dodd | 335/299 |
| 8,089,281 B2 * | 1/2012 | Zhai et al. | 324/318 |
| 2006/0158189 A1 | 7/2006 | Saylor et al. | |
| 2008/0130824 A1 * | 6/2008 | Fujisawa | 378/4 |
| 2010/0026303 A1 * | 2/2010 | Zhai et al. | 324/318 |
| 2010/0213941 A1 * | 8/2010 | Driesel et al. | 324/322 |

FOREIGN PATENT DOCUMENTS

| | | |
|---|---|---|
| EP | 0177855 A2 | 4/1986 |
| WO | 2005050239 A1 | 6/2005 |
| WO | 2005111646 A1 | 11/2005 |
| WO | 2005124381 A2 | 12/2005 |
| WO | 2006095297 A1 | 9/2006 |
| WO | 2006120588 A1 | 11/2006 |
| WO | 2006134557 A1 | 12/2006 |

* cited by examiner

SINUSOIDALLY RESONANT RADIO FREQUENCY VOLUME COILS FOR HIGH FIELD MAGNETIC RESONANCE APPLICATIONS

The following relates to the magnetic resonance arts. It finds particular application in magnetic resonance imaging at high magnetic fields (e.g., about 3 Tesla or higher), and is described with particular reference thereto. However, the following finds more general application in magnetic resonance imaging, magnetic resonance spectroscopy, and the like performed at substantially any magnetic field.

A birdcage-type quadrature radio frequency coil consists of a plurality of parallel rungs arranged axially, parallel with the static $B_0$ magnetic field through the examination region. End-rings disposed at opposite ends of the rungs interconnect the rungs and distribute current around the rungs sinusoidally. At frequencies below 128 MHz, such a coil when driven in quadrature provides a substantially uniform transverse $B_1$ field through the volume. Quadrature birdcage-type coils have been found to be effective volume coils such as whole-body coils, head coils, and so forth. The open cylindrical structure of a birdcage coil without a close fitting ground shield is advantageous for head coil applications as the open geometry reduces the patient's tendency toward anxiety or claustrophobia.

Higher static $B_0$ magnetic fields result in higher frequency nuclear magnetic resonance (NMR, proportional to $B_0$ field strength) and increased signal strength. However, the open head birdcage coil results in increased radiative losses at higher frequencies, and hence lower coil efficiency. Similar radiative loss and coil efficiency issues arise in using birdcage coils at high field for other applications. Radiative losses can be reduced somewhat by including an outer radio frequency shield of a conductive mesh or other material, but at the cost of a less open geometry and possible patient anxiety or claustrophobia. An end cap version of a birdcage coil may be used to further reduce radiation from one end of the coil, but radiative losses remain problematic at the open end of the end-capped coil.

At a static magnetic field of 7 Tesla or higher, where a close fitting cylindrical radio frequency (RF) ground is desired, a transverse-electromagnetic (TEM) coil may be used. In a TEM coil, the rungs are replaced by rods, which are also parallel conductors arranged parallel with the static $B_0$ magnetic field through the examination region. Unlike the birdcage geometry, however, the rods of the TEM coil are terminated at each end by electrical connection with the surrounding cylindrical radio frequency shield. A TEM coil does not have end rings to distribute current amongst the rods. The TEM coil operatively differs from the birdcage coil in its resonance modes—each rod of the TEM coil resonates with a conductive return path through the shield. The integrated radio frequency shield of the TEM coil and its consequent shielded geometry can have separate tuning and excitation of the various rods.

In the case of a head coil application, both birdcage and TEM coils can have problematic coupling with the patient's shoulders which breaks the coil symmetry. It is known to modify the coil design to be asymmetric in design so as to reduce RF coupling and radiation losses. In some such asymmetric designs, an end cap is included at the end distal from the shoulders (in the case of a birdcage head coil, the endcap may replace the end-ring at the closed end). A conducting end flange at the shoulder end of the head coil can to some extent reduce coupling to the shoulders and improve coil performance.

In addition to the aforementioned problems of radiative efficiency losses, claustrophobic closed geometries, and $B_1$ field non-uniformities, birdcage and TEM coils share the disadvantage of being relatively complex, including a substantial number of rungs or rods (for example, 8, 16, or more rungs or rods are not uncommon), end-rings or end caps, and enclosing cylindrical shields optionally including flanges. Each of these components, and their respective positioning relative to one another and relative to other conductive components of the magnetic resonance scanner, can affect the resonance characteristics (e.g., resonance frequency, resonance quality or Q-factor, and so forth), making tuning of the birdcage or TEM coil a complex process. These difficulties become still more problematic when two or more coils are to be used together for multi-nuclear imaging or spectroscopy.

For multi-nuclear studies, it is known to have a birdcage or TEM coil "double-tuned" to the magnetic resonance frequencies of two different nuclei (usually a reference $^1$H magnetic resonance and the magnetic resonance of another nuclear species of interest) through the use of interleaving rungs or rods. However, if two different nuclear species (in addition to the reference $^1$H species) are to be studied, then this approach is insufficient, and some sort of coil swapping is typically employed. For example, high-field magnetic resonance brain imaging sometimes uses the $^{31}$P and $^{13}$C species—accordingly, a first double-tuned coil resonating at the $^1$H and $^{31}$P magnetic resonance frequencies, and a second double-tuned coil resonating at the $^1$H and $^{13}$C magnetic resonance frequencies, are swapped in and out as needed. Such physical swapping can lead to positioning errors and increases the duration of the imaging session. Physical swapping is especially problematic in studies that monitor influx and egress of a magnetic contrast agent, since timing is critical for such studies.

Accordingly, there remains an unfulfilled need in the art for a radio frequency coil for use as a volume transmit or transmit/receive coil, that has relatively few components, has an open geometry, and generally overcomes other difficulties of existing birdcage and TEM coils.

The following provides a new and improved apparatuses and methods which overcome the above-referenced problems and others.

In accordance with one aspect, a radio frequency coil assembly is disclosed, comprising: an annular conductor configured to support a sinusoidal electrical current distribution at a magnetic resonance frequency; and a radio frequency shield shielding the annular conductor in at least one direction, the radio frequency shield including at least one of (i) a cylindrical shield portion surrounding a perimeter of the annular conductor, and (ii) a planar shield portion arranged generally parallel with the annular conductor.

In accordance with another aspect, a magnetic resonance scanner is disclosed, comprising: a magnet generating a static magnetic field; a magnetic field gradient system configured to superimpose selected magnetic field gradients on the static magnetic field; and a radio frequency coil assembly including an annular conductor defining a coil plane arranged generally transverse to the static magnetic field, the annular conductor configured to at least one of transmit and detect a $B_1$ field transverse to the static magnetic field.

In accordance with another aspect, a magnetic resonance method is disclosed, comprising: generating a static magnetic field; selectively superimposing selected magnetic field gradients on the static magnetic field; and generating or detecting a $B_1$ field at a magnetic resonance frequency by at least one of (i) circulating a sinusoidal current distribution along a substantially circular path arranged generally transverse to the static magnetic field and (ii) detecting an induced sinusoidal current distribution in a substantially circular path arranged generally transverse to the static magnetic field.

One advantage resides in providing a radio frequency coil assembly that can be concurrently tuned to two, or more, different magnetic resonance frequencies.

Another advantage resides in improved and more rapid multi-nuclear imaging and spectroscopy.

Another advantage resides in providing a more visually open volumetric radio frequency coil assembly for use at high magnetic fields.

Another advantage resides in simplicity of design and relatively few components.

Still further advantages of the present invention will be appreciated to those of ordinary skill in the art upon reading and understand the following detailed description.

Figure 1:
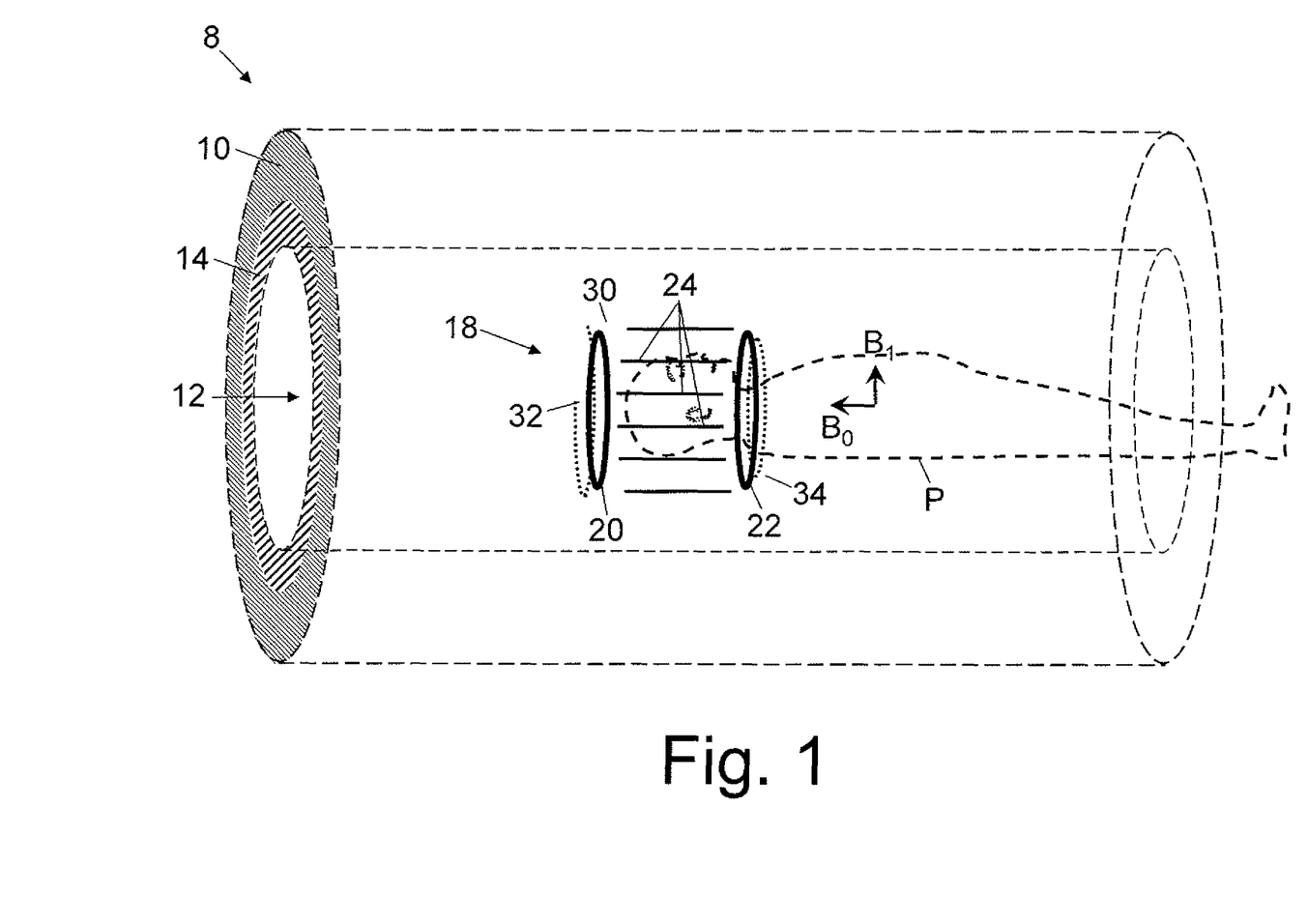
FIG. 1 diagrammatically shows a magnetic resonance scanner including a radio frequency coil assembly.

With reference to FIG. 1, an illustrative bore-type magnetic resonance scanner 8 includes a magnet 10 generating a static magnetic field $B_0$ oriented parallel with a bore opening 12 of the scanner 8. The magnet 10 can be a superconducting or resistive magnet. Other geometries besides the illustrated horizontal bore geometry can be implemented. The magnetic resonance scanner 8 further includes a magnetic field gradient system 14 configured to superimpose selected magnetic field gradients on the static magnetic field $B_0$. In some embodiments, the magnetic field gradient system 14 includes windings for selectively generating three orthogonal magnetic field gradients, for example along orthogonal designated x-, y-, and z-directions. The axial or $B_0$ direction is designated z, and the transverse directions x and y contain the $B_1$ RF fields. Typically, the magnetic field gradient system is disposed inside of the magnet, as the illustrated magnetic field gradient system 14 is disposed inside of the illustrated magnet 10; however, other configurations are also contemplated, such as an arrangement disclosed in Overweg, Intl Appl. No. WO 2005/124381 in which the gradient coil windings are disposed outside of the magnet and the generated magnetic field gradients are coupled into the bore opening by a ferromagnetic yoke. In FIG. 1, the magnet 10 and magnetic field gradient system 14 are diagrammatically shown as transparent to reveal the interior of the bore opening 12.

In operation, one or more radio frequency coils, such as an illustrative radio frequency coil assembly 18, are energized by a suitable radio frequency electric current at one or more magnetic resonance frequencies to excite magnetic resonance in one or more nuclear species, such as the $^1H$, $^{13}C$, $^{31}P$, $^{23}Na$, $^{19}F$, or other nuclear species. One or more magnetic field gradients are typically applied by the magnetic field gradient system 14 to spatially limit and/or encode the excited magnetic resonance or resonances. The excited magnetic resonances are read out by one or more of the radio frequency coils 18, 20. The readout or receive coil may be the same or different from the radio frequency coil used for excitation. The illustrated radio frequency coil assembly 18 is a head coil arranged to image the head of a patient P shown in phantom; however, the coil can be used for other imaging applications, for spectroscopy applications, and so forth.

Figure 2:
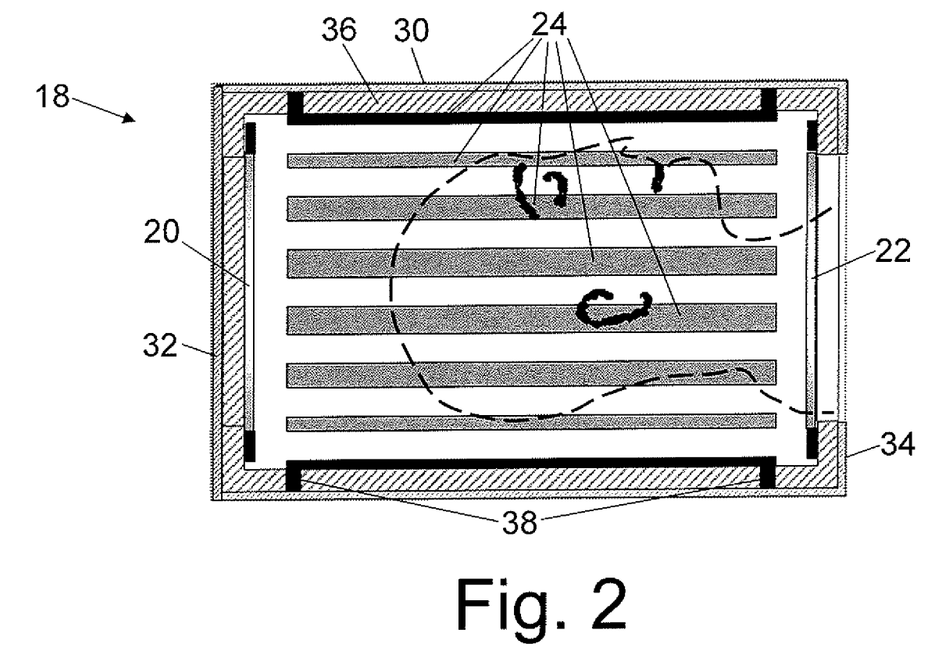
FIG. 2 diagrammatically shows a side sectional view of the radio frequency coil assembly of FIG. 1.

With continuing reference to FIG. 1 and with further reference to FIG. 2, the illustrated radio frequency coil assembly 18 includes three independently operable radio frequency coils, namely a first coil defined by a first annular conductor 20, a second coil defined by a second annular conductor 22, and a TEM coil defined by rod conductors 24 arranged parallel to one another and transverse to the annular conductors 20, 22. The annular conductors 20, 22 are generally circular, although some deviation from a perfect circular geometry is contemplated. The radio frequency coil assembly 18 further includes a surrounding generally cylindrical radio frequency shield 30. In the illustrative radio frequency coil assembly 18, the generally cylindrical radio frequency shield 30 includes an end-cap 32 that with adjacent regions of the cylindrical shield 30 contributes to shielding the first annular conductor 20, and a flange 34 that with adjacent regions of the cylindrical shield 30 contributes to shielding the second annular conductor 22. The conductors 20, 22, 24 are disposed on inside surfaces of a generally cylindrical dielectric former 36 having a single end-cap. The dielectric former 36 also provides the supporting substrate for the shield elements 30, 32, 34 which are disposed on an outer surface of the end-capped generally cylindrical dielectric former 36. Alternatively, some or all of the conductors and shield elements may be free-standing, embedded in a dielectric support, or so forth. The first and second annular conductors 20, 22 are spaced apart from each other, from the rod conductors 24, and from the shield elements 30, 32, 34. On the other hand, the rod conductors 24 are electrically connected at their ends with the generally cylindrical shield 30 by connections 38. Although conductive connections 38 are shown, in some embodiments the electrical connection of the rod conductors to the shield in the TEM coil may be by capacitive couplings, inductive couplings, or so forth. Note that in more diagrammatic FIG. 1, the dielectric former 36 and conductive connections 38 are not illustrated or labeled, and the conductors 20, 22, 24 are represented diagrammatically by curved or straight lines. In the illustrated embodiment, the supporting former 36 is shown inside of the shielding elements 30, 32, 34; however, it is also contemplated to arrange the supporting former outside of the shielding elements.

Each of the first and second substantially circular conductors 20, 22 is configured to support a sinusoidal electrical current distribution at respective first and second magnetic resonance frequencies, which may be the same or different frequencies. The TEM coil defined by the conductors 24 is configured to support resonance at a third magnetic resonance frequency, which may be the same or different from the first and second magnetic resonance frequencies. In some embodiments, the TEM coil defined by the conductors 24 is configured to resonate at a third magnetic resonance frequency (which may be the same or different from the first and second magnetic resonance frequencies) and at a fourth, different, magnetic resonance frequency.

Figure 3:
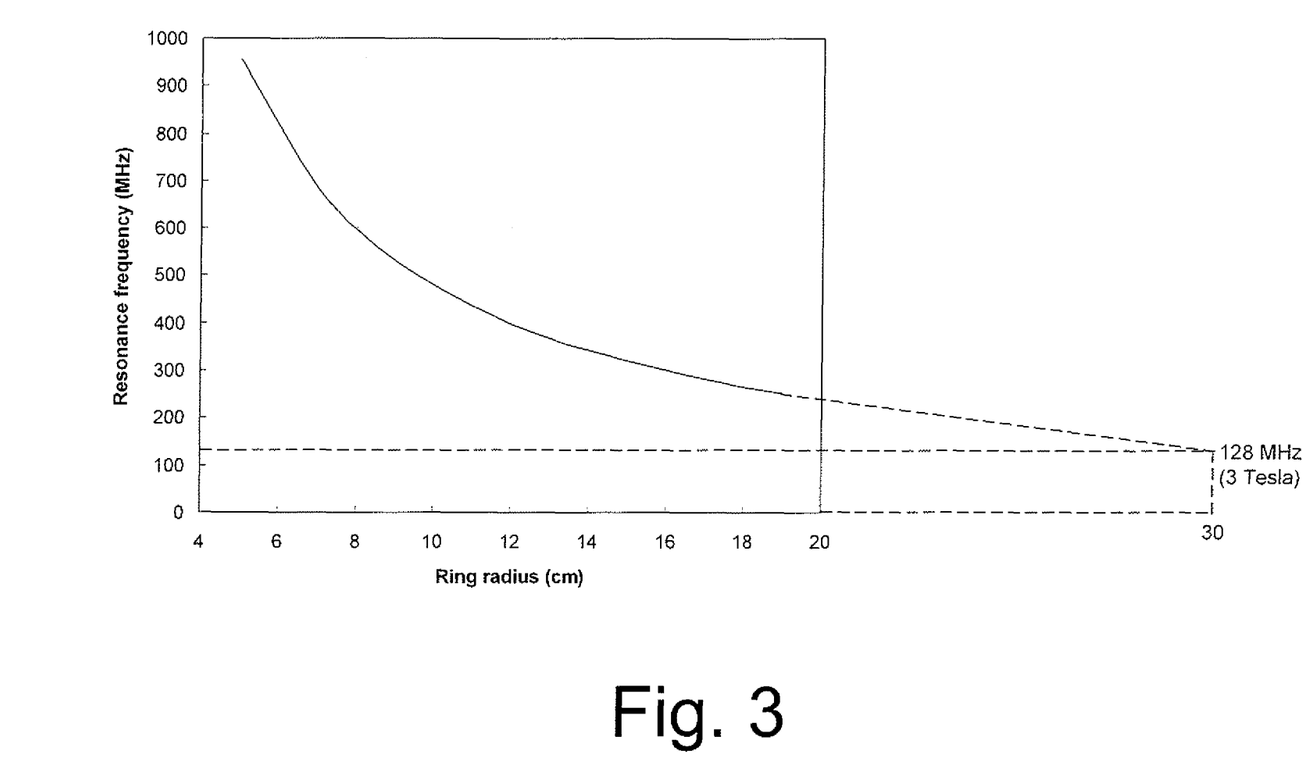
FIG. 3 plots sinusoidal resonance frequency for a continuous unshielded circular annular conductor without intervening capacitance or inductance elements, as a function of radius of the circular annular conductor.

With reference to FIG. 3, heretofore the sinusoidal mode of an unshielded circular conductor, e.g. without the presence of the cylindrical shield 30, the end-cap 32 and the flange 34, has not been considered to be of value for magnetic resonance imaging or spectroscopy, because the resonance frequency was deemed to be too high, the resonance quality was deemed too low, and the generated $B_1$ field was deemed to be too non-uniform. However, the inventors have recognized that for high-field magnetic resonance and for an annular conductor of sufficiently large radius, the sinusoidal mode circulates at a useful frequency range matching certain magnetic resonance frequencies of interest. For instance, the $^1H$ magnetic resonance frequency is 298 MHz in a static ($B_0$) magnetic field of 7 Tesla. As indicated in FIG. 3, the sinusoidal resonance of a circular annular conductor having a reasonable radius of about 15 centimeters, which is a typical radius for a human head coil, is in close range to the $^1H$ magnetic resonance frequency. Taking into account the effect of the cylindrical shield 30, the end-cap 32 and the flange 34, the resonance frequency of the sinusoidal mode can be closely matched to 298 MHz. The cylindrical shield 30, the end-cap 32 and the flange 34 also sharpens the resonance quality (Q-factor) of the annular conductor. Moreover, the inventors have recognized that at higher magnetic field, the spatial uniformity is largely determined by the dielectric and conductive characteristics of the patient or other subject loading the coil; hence, at static $B_0$ magnetic field values greater than or about 3 Tesla, the relatively large unloaded non-uniformity of the $B_1$ field generated by the sinusoidal mode is acceptable.

With continuing reference to FIG. 3, it can be seen that when the annular conductor is a generally circular conductor having a radius of between about 10 centimeters and about 20 centimeters, the resonance frequency for the sinusoidal mode is between about 200 MHz and about 500 MHz (taking into account the effects of the cylindrical shield 30, the end-cap 32 and the flange 34, and allowing for optional tuning by adding reactance elements such as capacitances or capacitive gaps in the annular conductor). These resonance frequencies span the magnetic resonance frequencies of some of the nuclear species of interest at high magnetic field. Moreover, a circular annular conductor with a smaller radius can also be tuned to an interested magnetic resonance frequency by adding lumped inductances along the annular conductor. For example, electromagnetic simulations were performed to simulate the sinusoidal mode supported by the annular conductor 22 formed as a 1-centimeter wide conductive annular trace having a radius of 7 centimeters, formed on the dielectric former 36 with a dielectric constant $\epsilon_r$=2.1 and thickness of 1.5 centimeters (defining the spacing of the conductive annular trace from the flange 34). In the simulation, the annular conductor was tuned to 298 MHz (corresponding to the $^1H$ magnetic resonance frequency in a 7 Tesla static $B_0$ magnetic field) by opening eight gaps distributed evenly along the annular conductor 22 and placing a capacitor in series with an inductor in each of the eight gaps in the annular conductor 22.

FIG. 3 shows an extrapolation of the calculated curve out to 128 MHz (extrapolation indicated by dashed lines), corresponding to a static magnetic field of about 3 Tesla. It can be estimated that a generally circular conductor has a resonance at a diameter of about 75 cm of about 128 MHz (c/128 MHz/$\pi$). This can be tuned by varying parameters such as the precise radius, the thickness or other cross-sectional dimensions of the annular conductor, by the effect of the cylindrical shield 30, by adding reactance elements such as capacitances or capacitive gaps in the annular conductor, or so forth.

Advantageously, the extrapolation indicates that a circular conductor having a diameter range of from 60 centimeters (30 centimeters radius) to 70 centimeters (35 centimeters radius), which is the typical diameter for a whole body radio frequency coil, is readily tuned to match the $^1H$ proton magnetic resonance frequency at 3 Tesla of 128 MHz.

Another configuration that is contemplated as being useful for certain types of medical imaging is a generally circular conductor coil with a radius less than 10 centimeters, with the coil tuned to a magnetic resonance frequency between about 200 MHz and about 500 MHz by use of inductive elements. Another configuration that is contemplated as being useful for certain types of medical imaging is a generally circular conductor coil with a radius of less than 12 centimeters, with the coil tuned to a magnetic resonance frequency less than about 200 MHz by use of inductive elements.

Figure 4:
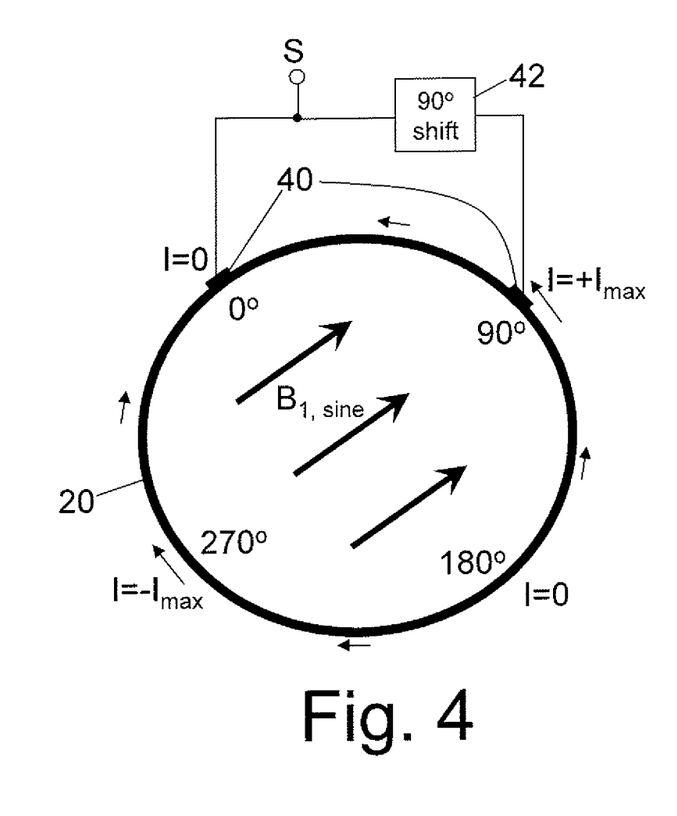
FIG. 4 diagrammatically shows the sinusoidal resonance mode of one of the annular conductors of the radio frequency coil assembly of FIGS. 1 and 2.

FIG. 4 shows the sinusoidal oscillation mode of the illustrative circular conductor 20 (the analysis for the second annular conductor 22 is analogous). The current distribution around the annular conductor 20 is sinusoidal with a spatial period equal to the circumference of the annular conductor 20. Accordingly, at any given time there are two current distribution nulls, one maximum positive current amplitude point, and one maximum negative current amplitude point. At the time instant illustrated in FIG. 4, the two current distribution nulls are positioned at points designated as 0° and 180°, the maximum positive current amplitude ($+I_{max}$) point is at 90°, and the maximum negative current amplitude point ($-I_{max}$) is at 270°. The resulting $B_1$ field on either side of the plane of the annular conductor 20 is directed parallel with the plane of the annular conductor 20. With the implementation of end-cap 32 and flange 34, radiation loss to the outside of the coil 18 is constrained. Advantageously, a quadrature radio frequency coupling 40 is optionally electrically connected with the annular conductor 20 for generating or detecting the sinusoidal electrical current distribution supported by the annular conductor at the magnetic resonance frequency. For example, an input signal S is suitably fed directly into one input of the quadrature coupling 40, and is suitably fed into the other input of the quadrature coupling 40 via a 90° phase shifter 42. An advantage of such a quadrature driving configuration is that more input power can be fed into the annular conductor 20 by the quadrature coupling 40 as compared with a linear coupling. Similarly in the readout mode, more magnetic resonance signal can be detected by the quadrature coupling 40.

With reference to FIG. 1, the radio frequency coil assembly 18 is positioned inside the bore opening 12 of the magnetic resonance scanner 8 with the static axial $B_0$ magnetic field oriented transverse to the annular conductors 20, 22, and hence the $B_1$ fields generated by the sinusoidal mode supported by the annular conductors 20, 22 are oriented transverse to the static $B_0$ magnetic field. Advantageously, this orientation in which the $B_0$ and $B_1$ fields are mutually orthogonal maximizes sensitivity of the annular conductors 20, 22 as sources for exciting magnetic resonance or as detectors for detecting magnetic resonance.

Moreover, the orientation of the radio frequency coil assembly 18 is suitable for receiving a patient's head or other extremity into the substantially hollow interior of the radio frequency coil assembly 18 through the opening defined by the flange 34. In head imaging, the flange 34 advantageously reduces radiative coupling of the coils with the shoulders of the patient.

The conductors 20, 22, 24 are suitably formed as microstrip transmission lines in which the shielding elements 30, 32, 34 serve as the ground plane, although free-standing conductors, freestanding shielding structures, or other physical implementations can also be used. The end-cap 32 and/or flange 34 are optionally omitted; however, including these components was shown by electromagnetic simulations to substantially improve the resonance quality (e.g., the Q factor of the resonant peaks).

The illustrated radio frequency coil assembly 18 can be tuned to one, two, three, or even four different magnetic resonance frequencies. Four different magnetic resonance frequencies are achieved if each annular conductor 20, 22 is tuned to a different magnetic resonance frequency, and additionally the TEM coil is dual-tuned. Accordingly, the illustrated radio frequency coil assembly 18 is well-suited for performing multi-nuclear imaging, multi-nuclear spectroscopy, and the like.

For performing multi-nuclear magnetic resonance probing deep into an imaging subject, a volume transmit/receive (T/R) coil is advantageous. At high static magnetic field, for example at 7 Tesla, the one or more sinusoidally resonant annular conductors inside the radio frequency shielding 30, 32, 34 suitably generate substantial transverse $|B_1^+|$-field coverage. In one suitable approach, the two annular conductors 20, 22 are tuned for imaging via the sinusoidal resonance mode resonating at the $^1H$ proton magnetic resonance frequency. In multi-nuclear imaging or spectroscopy, the $^1H$ signal is sometimes used to acquire reference proton images or other baseline information. The TEM coil defined by the rod conductors 24 are tuned to the magnetic resonance frequency of another nuclear species of interest, such as the magnetic resonance frequency of the $^1H$, $^{13}C$, $^{31}P$, $^{23}Na$, $^{19}F$, or another nuclear species. Where the TEM coil is also tuned to the $^1H$ resonance it may be used as a multi-element receive or transmit/receive coil in combination with the coils 20, 22. Optionally, the TEM coil is a dual-tuned coil that supports resonances at two different magnetic resonance frequencies. It is also contemplated for the two annular conductors 20, 22 to be tuned to two different magnetic resonance frequencies in conjunction with a doubly-tuned TEM coil, so as to provide a quadruple tuned radio frequency coil assembly. Additional resonance frequencies can be attained by tuning some of the TEM coil elements to additional frequencies.

Figure 5:
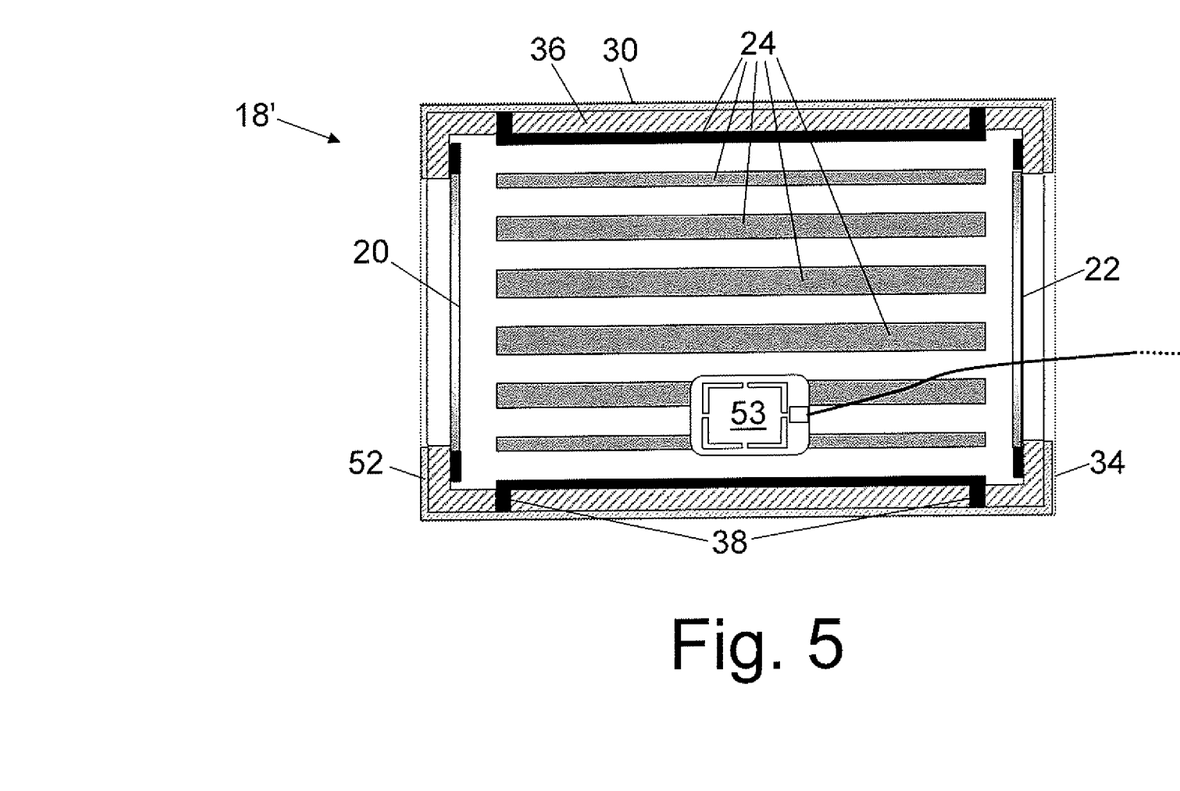
FIG. 5 diagrammatically shows a side sectional view of a radio frequency coil assembly similar to that of FIG. 2, but with the shielding end-cap replaced by a second shielding flange.

With reference to FIG. 5, a modified radio frequency coil assembly 18' is like the radio frequency coil assembly 18 of FIGS. 1 and 2, except that the end cap shield element 32 of the coil assembly 18 is replaced by a second flange 52 in the coil assembly 18'. The modified radio frequency coil assembly 18' was simulated by electromagnetic modeling at a static $B_0$ magnetic field of 7 Tesla. The modeled cylindrical shield 30 had the diameter of 35 centimeters and length of 23 centimeters. The flanges 34, 52 each had inner diameter 27 centimeters. The annular conductors 20, 22 were each modeled as 1 centimeter-wide annular copper traces. The dielectric substrate 36 was modeled to have a thickness of 1 centimeter and a dielectric constant $\epsilon_r=2.1$. The two annular conductors 20, 22 were modeled to include sixteen ring capacitors, each of about 30 picoFarads, evenly distributed around the annular conductor so as to tune the annular conductors 20, 22 to the $^1H$ magnetic resonance frequency (that is, 298 MHz at 7 Tesla). Sixteen rod conductors 24 of the TEM coil were modeled, each modeled as sixteen 16 centimeters long, and were located inside the cylindrical shield 30 at a radial position of 15 centimeters. The ends of each rod conductor 24 were modeled as electrically connected to the shield 30 via a suitable tuning capacitor. The modeled TEM coil was tuned to the $^{31}P$ magnetic resonance frequency (that is, 120.7 MHz at 7 Tesla).

In the modeling, some space was left between the ends of the rod conductors 24 and the annular conductors 20, 22 so as to have negligible coupling between them. However, coupling between the annular conductors 20, 22 and the TEM rod conductors 24 is generally low enough to be negligible, because the TEM coil does not support circular "ring" currents. Rather, the TEM modes flow along the rods 24 and return along an anti-parallel path through the cylindrical shield 30, and hence the TEM currents generally flow transverse to the flow of current in the annular conductors 20, 22.

Multi-nuclear magnetic resonance imaging of the brain sometimes uses the $^{31}P$ and $^{13}C$ magnetic resonances, and additionally typically uses the $^1H$ magnetic resonance for pilot imaging or other baseline or reference data acquisition, or for decoupling experiments. For such an application, the TEM coil is suitably double tuned by using the interleaving rod conductors 24 in accordance with known approaches. Triple tuning capability is suitably imparted to the radio frequency coil assembly 18 (or to the radio frequency coil assembly 18') by having one or two annular conductors 20, 22 tuned to a third magnetic resonance frequency different from the two TEM frequencies.

As an example, an electromagnetic simulation was made of a doubly-tuned TEM coil tuned to the $^{31}P$ and $^{13}C$ magnetic resonance frequencies at a static $B_0$ magnetic field of 7 Tesla, with the two annular conductors 20, 22 both tuned to the $^1H$ magnetic resonance frequency (298 MHz at 7 Tesla). The TEM coil was modeled as a sixteen-rod TEM coil tuned using two sets of capacitor values placed in interleaving rod conductors 24. Eight rod conductors used for the $^{31}P$ magnetic resonance frequency (120.7 MHz) were modeled as having capacitors of 52 picoFarads, while the eight interleaved rod conductors used for the $^{13}C$ magnetic resonance frequency (74.9 MHz) were modeled as having capacitors of 132 picoFarads. The $|B_1^+|$-field distributions were modeled in the central transverse slice of a 20 centimeter-diameter loading spherical phantom ($\sigma=0.855$S/m, $\epsilon_r=80$), with both the $^{31}P$ rods and $^{13}C$ rods driven in quadrature using a four-port feed to the TEM coil. The two annular conductors 20, 22 tuned to the $^1H$ $|B_1^+|$-field were also driven in quadrature using a two-port feed in which one port drives the first annular conductor 20 in an "x"-mode and the other port drives the second annular conductor 22 in a "y"-mode. Acceptable $|B_1^+|$-field homogeneity was achieved at all three magnetic resonance frequencies, namely at the $^1H$, $^{31}P$ and $^{13}C$ magnetic resonance frequencies. Table 1 shows the calculated transmit efficiency $|B_1^+|_{ave}/\sqrt{P_{abs}}$ at the three magnetic resonance frequencies, where $|B_1^+|_{ave}$ is the average $|B_1^+|$-field in the center slice of the sphere phantom and $P_{abs}$ is the total absorbed power. In Table 1, the transmit efficiency increases as the magnetic resonance frequency decreases.

TABLE 1

| Multi-nuclear frequency | Transmit efficiency ($\mu T/W^{1/2}$) |
| --- | --- |
| Annular rings at 298 MHz ($^1H$) | 0.43 |
| 8-interleaving TEM elements at 120.7 MHz ($^{31}P$) | 0.84 |
| 8-interleaving TEM elements at 74.9 MHz ($^{13}C$) | 1.22 |

Additional electromagnetic modeling was conducted to see how much coupling occurs between the annular conductors 20, 22 and the inside TEM rod conductors 24. Calculations showed that, when the two annular conductors 20, 22 transmit at the higher frequency of 298 MHz, the transmit efficiency has almost no change with and without the decoupling of the TEM coil (in the model, the decoupling was modeled by opening a gap in the TEM rod conductors 24). This indicates good intrinsic isolation between $^1H$ frequency and the other multi-nuclear frequencies. Accordingly, $^1$H nuclear decoupling can be performed. For example, simultaneous transmit at two frequencies or simultaneous transmit on the $^1$H coil while receiving of magnetic resonance of another nuclear species using the TEM coil is feasible. For a dual-tuned TEM coil, the two tuned frequencies are intrinsically decoupled from each other when interleaving rungs are used.

Optionally, for example to facilitate multi-channel SENSE multi-nuclear imaging, each rod conductor 24 can be terminated by tuning capacitors to the cylindrical radio frequency shield 30, and each transmit/receive (T/R) channel can correspond to one or more such rod conductors 24. For example, in one approach for multi-nuclear imaging, all the rod conductors 24 are either tuned to the same non-$^1$H magnetic resonance frequency, or interleaving rod conductors 24 are tuned to different non-$^1$H magnetic resonance frequencies to double tune to two or more different non-$^1$H magnetic resonance frequencies. A volume coil for coupling to the $^1$H magnetic resonance frequency is suitably defined using the two annular conductors 20, 22 tuned to the $^1$H magnetic resonance frequency. In this configuration, SENSE imaging or spectroscopy can be applied for the one, two, or more non-$^1$H magnetic resonance frequencies coupled to the TEM coil in the same anatomic regions at the same time, while the volume coil defined by the two annular conductors 20, 22 provide reference $^1$H magnetic resonance images or other baseline or reference $^1$H data.

Additional operational flexibility is optionally achieved by operating the two annular conductors 20, 22 together or independently. As an example, consider use of the radio frequency coil assembly 18' of FIG. 5 for brain imaging, with the subject's head centered in the coil assembly. If an axial slice or slab located a few centimeters above the center axial slice (that is, in the top part of the brain) is to be imaged, then it is sufficient to drive only the annular conductor located distal from the top of the head in quadrature and to de-tune the annular conductor proximate to the top of the head to keep it from resonating. Electromagnetic simulations indicate that the $|B_1^+|$-field uniformity for driving only one annular conductor in quadrature is substantially improved over the configuration in which both annular conductors 20, 22 are driven in quadrature at the same time. Indeed, the $|B_1^+|$-field standard deviation (no unit) when driving only one annular conductor in quadrature decreases by 53% as compared with driving both in quadrature at the same time. Table 2 show the calculated transmit efficiency and SAR differences, scaled to the $|B_1^+|$-field in the slice 5 centimeters above the center slice equal to 1 µT. It is seen that, at the slice of interest 5 centimeters above the center slice, driving the annular conductor distal from the slice of interest has similar transmit efficiency SAR as driving both annular conductors 20, 22 while increasing $|B_1^+|$-field uniformity. By comparison, in a conventional double-tuned TEM coil the more complex solution of using a multi-channel transmit configuration is typically resorted to in order to improve the $|B_1^+|$-field uniformity.

TABLE 2

| At slice 5 cm above center slice . . . | Driving both annular conductors | Driving only the distal annular conductor |
|---|---|---|
| Transmit efficiency (µT/W$^{1/2}$) | 0.39 | 0.37 |
| Whole-body SAR per 1 µT (W/kg) | 1.61 | 1.73 |
| Max. local SAR per 1 µT (W/kg) | 3.10 | 3.07 |

An advantage of the coil assemblies 18, 18' is that they are optionally visually open structures. For example, if the dielectric former or substrate 36 is transparent or is omitted in the gaps between the rod conductors 24, and the cylindrical shield 30 is formed as a conductive mesh or other relatively open structure, then the subject whose head is disposed in the coil assembly 18, 18' can see out of the coil assembly 18, 18'. Hence, the coil assembly is less visually confining, and the patient is relatively less likely to suffer anxiety or claustrophobia.

With reference to FIG. 5, a variation in which the TEM coil rod conductors 24 are omitted is considered. Consider the cylindrical shield 30 and the circular annular conductors 20, 22 disposed near respective flanges 52, 34. This coil optionally is configured to perform multi-nuclear acquisition by tuning the two annular conductors 20, 22 to different magnetic resonance frequencies, or can be used as a single-frequency volume coil by tuning the annular conductors 20, 22 to the same magnetic resonance frequency. When it used as a single-frequency volume coil, with suitable controllable de-tune circuitry implemented in annular conductors 20, 22, one or more local radio frequency receive or transmit/receive coils which are different from TEM coil rod conductors 24 can placed inside the volume coil for proton or multi-nuclear acquisition. For example, a surface coil 53 may be placed inside the volume coil for such acquisition.

Figure 6:
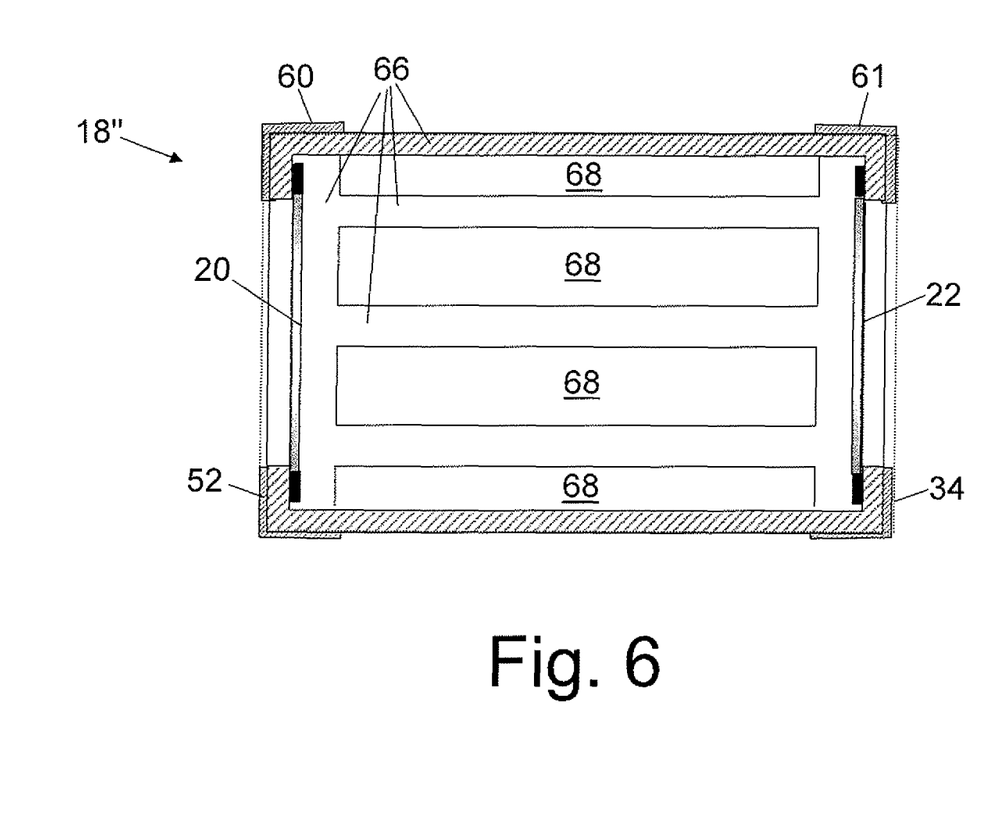
FIG. 6 diagrammatically shows a side sectional view of a radio frequency coil assembly similar to that of FIG. 5, but with the TEM coil rod conductors omitted and most of the cylindrical shield omitted to leave only end flange shield elements.

With reference to FIG. 6, a modified radio frequency coil assembly 18'' is similar to the coil assembly 18' of FIG. 5, except that the TEM coil rod conductors 24 and local surface coil 53 are omitted, and most of the cylindrical shield portion 30 is omitted leaving only annular shield portions 60, 61 surrounding respective annular conductors 20, 22 and connected with respective flanges 52, 34. Similarly in another contemplated embodiment, not shown here, a top region of the cylindrical shield portion 30 is omitted to increase openness for the patient's view while the bottom portion is kept to reduce radiation loss. This coil optionally can still perform multi-nuclear acquisition by tuning the two annular conductors 20, 22 to different magnetic resonance frequencies, or can be used as a single-frequency volume coil by tuning the annular conductors 20, 22 to the same magnetic resonance frequency. There is no TEM coil in the coil assembly 18''. Removal of the TEM coil and substantial portions of the surrounding shield 30 has the advantage that the dielectric former 36 can be replaced by a more open dielectric former 66 that includes supporting struts with large gaps 68 in-between to provide still more openness for the patient.

With reference back to FIG. 3, at a static $B_0$ magnetic field of about 3 Tesla the $^1$H magnetic resonance frequency is 128 MHz and an annular conductor having a diameter of about 60 centimeters resonates in the sinusoidal mode at this $^1$H frequency. The precise resonant frequency of the sinusoidal resonance depends on factors in addition to diameter, such as conductor width, spacing from and type of shielding, and so forth, and the precise resonant frequency can additionally be adjusted by inserting series capacitance elements such as discrete capacitors or capacitive gaps in the annular conductor. Accordingly, it is straightforward to design the annular conductor to meet design constraints including (i) a specific diameter and (ii) precise resonance at the $^1$H magnetic resonance frequency of 128 MHz for 3 Tesla.

Figure 7:
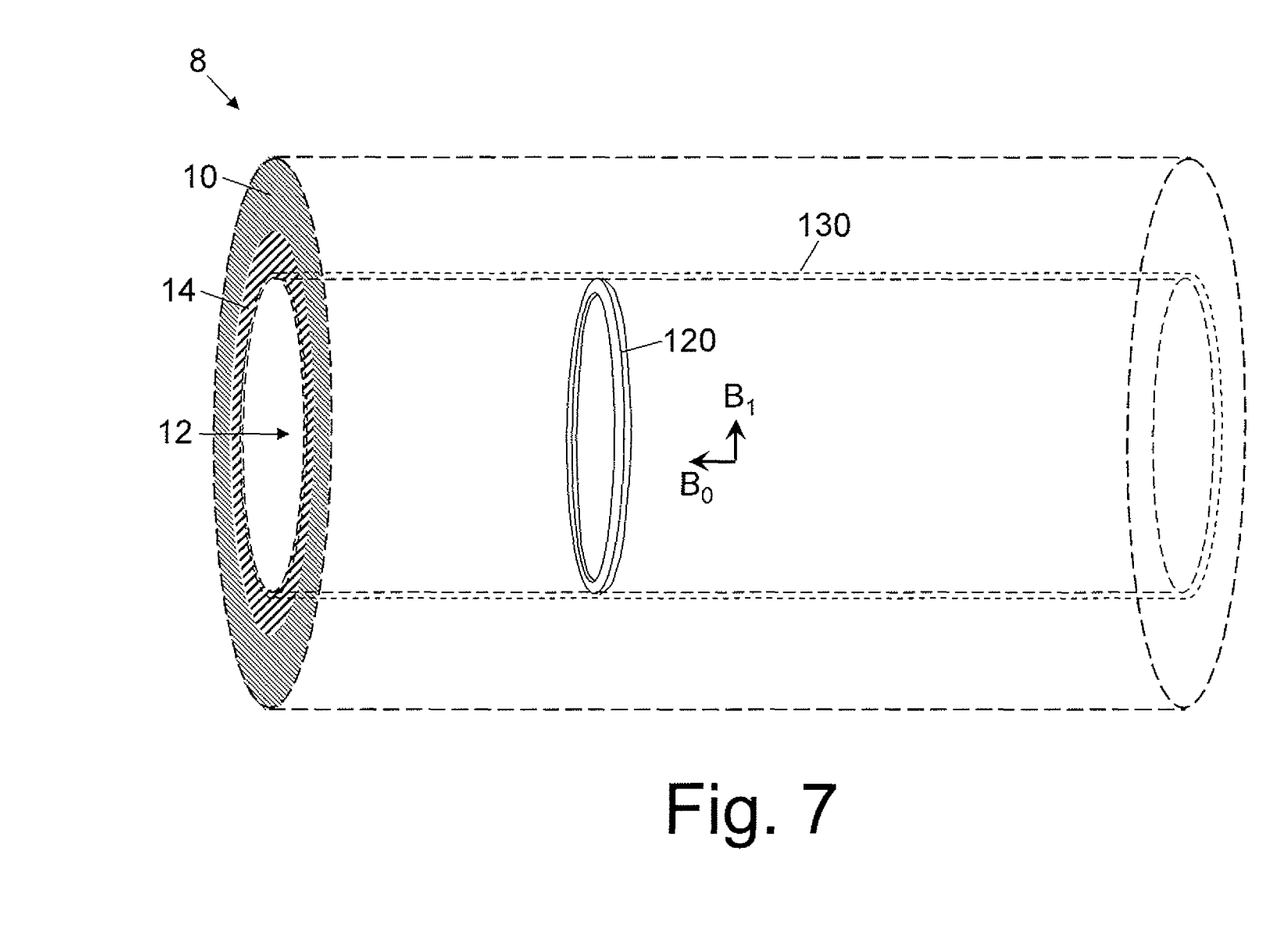
FIG. 7 diagrammatically shows the magnetic resonance scanner of FIG. 1, in which the frequency coil assembly of FIG. 1 is omitted and a whole-body coil is added comprising an annular conductor mounted in the bore opening.

With reference to FIG. 7, such an annular conductor 120 is suitably designed to resonate at 128 MHz and to fit snugly into the bore opening 12 of the magnetic resonance scanner 8, which in this embodiment operates to produce the static $B_0$ magnetic field at 3 Tesla. The annular conductor 120 is positioned with the plane of the annular conductor 120 generally transverse to the axis of the bore opening 12 and to the static $B_0$ magnetic field. In this position, the annular conductor 120 supports a sinusoidal mode generating or coupled with a $B_1$ field that is transverse to the $B_0$ field so as to be efficiently used to excite or detect $^1H$ magnetic resonance. Because the bore opening 12 has a constant diameter along its axis, in some embodiments the annular conductor 120 can be slid or otherwise moved to any selected position along the bore so as to optimally couple with a given subject positioned in the bore. This flexible arrangement is facilitated by including a cylindrical radio frequency shield 130 as a conductive mesh coating the bore liner, or disposed on a dielectric former arranged coaxial with the bore opening 12, or so forth.

While FIG. 7 shows a single annular conductor 120, it is contemplated to include two or more such annular conductors so as to couple with a larger volume. In one alternative embodiment, it is contemplated to include a plurality of annular conductors spaced apart along the bore, for example at 10-centimeter axial spacings. In this embodiment, the scanner operator can selectively use that one, or those two or more, selected annular rings that are best positioned for coupling with a given subject in a given position in the bore for magnetic resonance imaging or spectroscopy acquisition. In another embodiment, two annular conductors 120 with radiation-containing flanges similar to the flanges 34, 52 shown in FIGS. 5 and 6 can be integrated near the ends of the gradient system 14 or near the ends of the imaging region. The cylinder shield 130 is placed or integrated at or near the inner diameter of the gradient system 14. Such an arrangement makes efficient use of bore space that would otherwise be occupied by a conventional whole body radio frequency coil in a conventional magnetic resonance system, thus increases the patient's access space and reduces the tendency toward anxiety or claustrophobia.

Although the radio frequency coil assemblies 18, 18', 18" each include two annular conductors 20, 22 that are independently operable in sinusoidal mode, in some embodiments only one annular conductor may be included (either first annular conductor 20 or second annular conductor 22). Alternatively, three or more annular conductors may be included to enlarge the volume of excitation or reception, to excite or detect additional magnetic resonance frequencies for multinuclear experiments, or so forth. Moreover, the annular conductors can be positioned substantially anywhere along the radio frequency coil assembly, and are not limited to their illustrated positions at the ends of the radio frequency coil assemblies 18, 18', 18".

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A radio frequency coil assembly comprising:
   an annular conductor configured to support a sinusoidal electrical current distribution at a magnetic resonance frequency; and
   a radio frequency shield shielding the annular conductor in at least one direction, the radio frequency shield including at least one of (i) a cylindrical shield portion surrounding a perimeter of the annular conductor, and (ii) a planar shield portion arranged generally parallel with the annular conductor.

2. A magnetic resonance system comprising:
   a magnet which generates a static magnetic field ($B_0$) through an examination region;
   a magnetic field gradient system configured to superimpose selected magnetic field gradients on the static magnetic field; and
   a radio frequency coil assembly as set forth in claim 1.

3. The radio frequency coil set forth in claim 1 wherein the annular conductor has a circular geometry oriented substantially transverse to a static magnetic field ($B_0$).

4. The radio frequency coil assembly as set forth in claim 1, further comprising:
   a quadrature radio frequency coupling electrically connected with the annular conductor for generating or detecting a sinusoidal electrical current distribution supported by the annular conductor at said magnetic resonance frequency.

5. The radio frequency coil assembly as set forth in claim 1, wherein the annular conductor is not electrically connected with any transverse rung or rod conductors.

6. The radio frequency coil assembly as set forth in claim 1, wherein the annular conductor is a continuous conductive loop.

7. The radio frequency coil assembly as set forth in claim 1, wherein the annular conductor is segmented to define capacitive tuning gaps.

8. The radio frequency coil assembly as set forth in claim 1, wherein the annular conductor is segmented with reactive tuning gaps.

9. The radio frequency coil assembly as set forth in claim 1, wherein the annular conductor includes two annular conductors both supporting a sinusoidal electrical current distribution at the same frequency.

10. The radio frequency coil assembly as set forth in claim 1, wherein the annular conductor includes the two annular conductors which support at least one of quadrature transmit and quadrature receive with linear or quadrature coil excitation or coupling of each annular conductor.

11. The radio frequency coil assembly as set forth in claim 1, wherein the annular conductor includes two or more annular conductors.

12. The radio frequency coil assembly as set forth in claim 1, wherein the radio frequency shield includes a cylindrical shield portion surrounding the perimeter of the annular conductor.

13. The radio frequency coil assembly as set forth in claim 12, wherein the radio frequency shield further includes a planar annular flange shield portion electrically connected with and extending inwardly from an end of the cylindrical shield portion and arranged parallel with the annular conductor.

14. The radio frequency coil assembly as set forth in claim 12, wherein the radio frequency shield further includes a planar disk portion electrically connected with and closing off an end of the cylindrical shield portion and arranged parallel with the annular conductor.

15. A radio frequency coil assembly, including:
   an annular conductor configured to support a sinusoidal electrical current distribution at a magnetic resonance frequency;
   a radio frequency shield shielding the annular conductor in at least one direction, the radio frequency shield including at least one of (i) a cylindrical shield portion surrounding a perimeter of the annular conductor, and (ii) a planar shield portion arranged generally parallel with the annular conductor including a cylindrical shield portion; and a plurality of rod conductors arranged generally transverse to a plane of the annular conductor the rod conductors having ends electrically connected with the cylindrical shield portion to define a TEM coil, the rod conductors not being electrically connected with the annular conductor.

16. The radio frequency coil assembly as set forth in claim 15, wherein the annular conductor includes two parallel annular conductors configured to support sinusoidal electrical current distributions at respective first and second magnetic resonance frequencies.

17. The radio frequency coil assembly as set forth in claim 16, wherein the two parallel annular conductors are disposed at opposite ends of the plurality of rod conductors.

18. The radio frequency coil assembly as set forth in claim 16, wherein the first and second magnetic resonance frequencies are the same.

19. The radio frequency coil assembly as set forth in claim 18, wherein the TEM coil is configured to resonate at a third magnetic resonance frequency that is different from the first and second magnetic resonance frequencies.

20. The radio frequency coil assembly as set forth in claim 18, wherein the TEM coil is configured to resonate at third and fourth different magnetic resonance frequencies that are both different from the first and second magnetic resonance frequencies.

21. The radio frequency coil assembly set forth in claim 20 wherein each TEM element is configured as a transmit/receive element.

22. The radio frequency coil assembly set forth in claim 16, wherein each TEM element is configured as a transmit/receive element.

23. The radio frequency coil assembly as set forth in claim 16, wherein the first and second magnetic resonance frequencies are different magnetic resonance frequencies.

24. The radio frequency coil assembly as set forth in claim 23, wherein the TEM coil is configured to resonate at a third magnetic resonance frequency different from the first and second magnetic resonance frequencies.

25. The radio frequency coil assembly as set forth in claim 23, wherein the TEM coil is configured to resonate at third and fourth different magnetic resonance frequencies that are both different from the first and second magnetic resonance frequencies.

26. The radio frequency coil assembly as set forth in claim 15, wherein the annular conductor is configured to support a sinusoidal electrical current distribution at a first magnetic resonance frequency, and the TEM coil is configured to resonate at a second magnetic resonance frequency different from the first magnetic resonance frequency.

27. The radio frequency coil assembly as set forth in claim 1, wherein the annular conductor includes two parallel spaced apart annular conductors configured to support sinusoidal electrical current distributions at respective first and second magnetic resonance frequencies, and the radio frequency shield includes two spaced apart shield portions shielding the two parallel spaced apart annular conductors.

28. The radio frequency coil assembly as set forth in claim 27, wherein each one of the spaced apart shield portions include (i) a ground plane arranged parallel with the annular conductor and (ii) an annular shield portion surrounding a perimeter of the annular conductor.

29. The radio frequency coil assembly as set forth in claim 1, wherein the annular conductor is a generally circular conductor having one of:
a radius of between about 10 centimeters and about 20 centimeters, and said magnetic resonance frequency is at least about 200 MHz; and
a radius of between about 20 centimeters and about 40 centimeters, and said magnetic resonance frequency is less than about 200 MHz.

30. The radio frequency coil assembly as set forth in claim 1, wherein the annular conductor is a generally circular conductor having one of:
a radius less than 10 centimeters, and said magnetic resonance frequency is between about 200 MHz and about 500 MHz tuned by use of inductive elements; and
a radius of less than 12 centimeters, and said magnetic resonance frequency is less than about 200 MHz timed by use of inductive elements.

31. A magnetic resonance scanner comprising:
a magnet generating a static magnetic field ($B_0$);
a magnetic field gradient system configured to superimpose selected magnetic field gradients on the static magnetic field;
a radio frequency coil assembly including an annular conductor defining a coil plane arranged generally transverse to the static magnetic field ($B_0$), the annular conductor being configured to at least one of transmit and detect a $B_1$ field transverse to the static magnetic field;
a radio frequency shield having at least a cylindrical shield portion; and
a plurality of rod conductors arranged parallel with the static magnetic field ($B_0$) and having ends electrically connected with the cylindrical shield portion to define a TEM coil, the rod conductors not being electrically connected with the annular conductor.

32. The magnetic resonance scanner as set forth in claim 31, wherein the annular conductor defines one of a local coil and a whole-body coil.

33. A magnetic resonance method comprising:
generating a static magnetic field ($B_0$);
selectively superimposing selected magnetic field gradients on the static magnetic field;
generating or detecting a $B_1$ field in quadrature at a magnetic resonance frequency by at least one of (i) circulating a sinusoidal current distribution along a substantially circular path arranged generally transverse to the static magnetic field ($B_0$) and (ii) detecting an induced sinusoidal current distribution in a substantially circular path arranged generally transverse to the static magnetic field ($B_0$).

* * * * *